(12) United States Patent
Jeon et al.

(10) Patent No.: US 9,379,102 B2
(45) Date of Patent: Jun. 28, 2016

(54) NITRIDE-BASED SEMICONDUCTOR DEVICE

(71) Applicant: Samsung Electronics Co., Ltd., Suwon-Si, Gyeonggi-Do (KR)

(72) Inventors: Woo-chul Jeon, Daegu (KR); Ki-yeol Park, Suwon-si (KR); Young-hwan Park, Seoul (KR); Jai-kwang Shin, Anyang-si (KR); Jae-joon Oh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 185 days.

(21) Appl. No.: 13/926,553

(22) Filed: Jun. 25, 2013

(65) Prior Publication Data

US 2014/0021514 A1    Jan. 23, 2014

Related U.S. Application Data

(63) Continuation-in-part of application No. 13/734,347, filed on Jan. 4, 2013, now abandoned.

(30) Foreign Application Priority Data

Jul. 19, 2012  (KR) .................. 10-2012-0078957
May 2, 2013   (KR) .................. 10-2013-0049618

(51) Int. Cl.
*H01L 29/778*  (2006.01)
*H01L 27/06*   (2006.01)
*H01L 21/8252* (2006.01)

(52) U.S. Cl.
CPC ........ *H01L 27/0629* (2013.01); *H01L 21/8252* (2013.01); *H01L 27/0605* (2013.01)

(58) Field of Classification Search
CPC .............. H01L 29/778; H01L 29/7786; H01L 29/7787
See application file for complete search history.

(56) References Cited

U.S. PATENT DOCUMENTS

| | | |
|---|---|---|
| 8,044,434 B2 | 10/2011 | Ohta et al. |
| 2005/0142709 A1 | 6/2005 | Park |
| 2005/0194612 A1 | 9/2005 | Beach |
| 2008/0157121 A1 | 7/2008 | Ohki |
| 2009/0242943 A1 | 10/2009 | Kawasaki |

(Continued)

FOREIGN PATENT DOCUMENTS

| | | |
|---|---|---|
| JP | 2009124002 A | 6/2009 |
| JP | 2011210779 A | 10/2011 |

(Continued)

*Primary Examiner* — Jae Lee
(74) *Attorney, Agent, or Firm* — Harness, Dickey & Pierce

(57) ABSTRACT

A nitride-based semiconductor diode includes a substrate, a first semiconductor layer disposed on the substrate, and a second semiconductor layer disposed on the first semiconductor layer. The first and second semiconductor layers include a nitride-based semiconductor. A first portion of the second semiconductor layer may have a thickness thinner than a second portion of the second semiconductor layer. The diode may further include an insulating layer disposed on the second semiconductor layer, a first electrode covering the first portion of the second semiconductor layer and forming an ohmic contact with the first semiconductor layer and the second semiconductor layer, and a second electrode separated from the first electrode, the second electrode forming an ohmic contact with the first semiconductor layer and the second semiconductor layer.

6 Claims, 14 Drawing Sheets

(56) References Cited

U.S. PATENT DOCUMENTS

| | | |
|---|---|---|
| 2010/0006894 A1 | 1/2010 | Ohta et al. |
| 2011/0049574 A1* | 3/2011 | Ueno et al. ............... 257/201 |
| 2011/0057257 A1* | 3/2011 | Park et al. ............... 257/330 |
| 2012/0223317 A1* | 9/2012 | Bahl ............ H01L 29/4175 257/76 |

FOREIGN PATENT DOCUMENTS

| | | |
|---|---|---|
| KR | 2005-0066068 A | 6/2005 |
| KR | 20060110003 A | 10/2006 |
| KR | 2008-0063062 A | 7/2008 |
| KR | 2009-0104646 A | 10/2009 |
| KR | 20110105032 A | 9/2011 |

\* cited by examiner

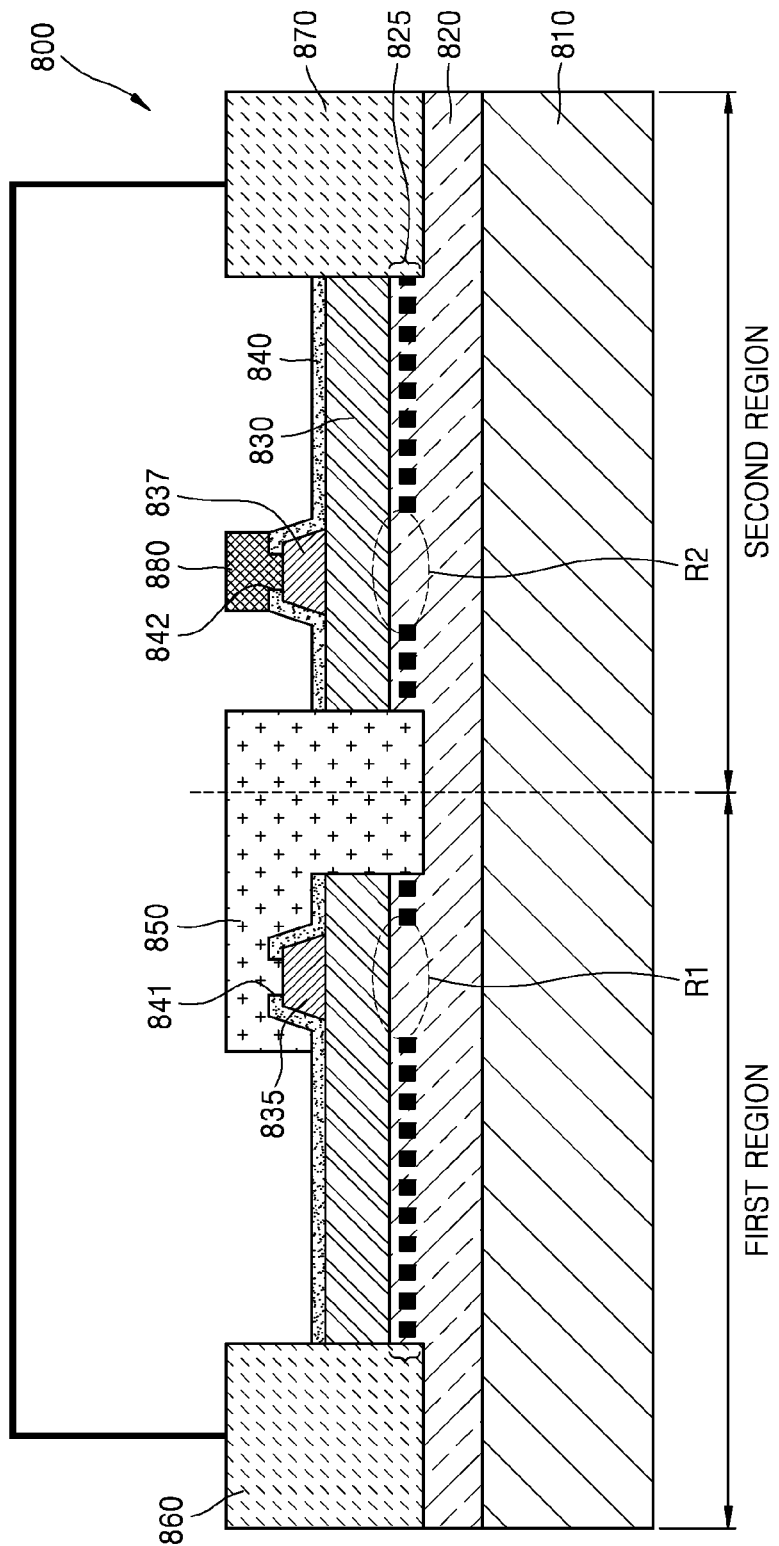

NITRIDE-BASED SEMICONDUCTOR DEVICE

CROSS-REFERENCE TO RELATED APPLICATIONS

This application is a Continuation-In-Part of U.S. patent application Ser. No. 13/734,347, filed on Jan. 4, 2013, in the United States Patent and Trademark Office, the entire contents of which is incorporated herein by reference. This application also claims the benefit of Korean Patent Application Nos. 10-2012-0078957, filed on Jul. 19, 2012, and 10-2013-0049618, filed on May 2, 2013, in the Korean Intellectual Property Office, the entire contents of each of which are incorporated herein by reference.

BACKGROUND

1. Field

At least one example embodiment relates to nitride-based semiconductor devices, and in particular, high-power nitride-based semiconductor diodes in which nitride-based semiconductors form a heterostructure and/or integrated devices using the same.

2. Description of the Related Art

Silicon (Si) and gallium arsenide (GaAs) are used in a wide range of semiconductor devices for low-power apparatuses and (in the case of Si) low-frequency apparatuses. However, these semiconductor materials have a limitation for use in high-power and/or high-frequency devices due to their relatively small bandgaps (for example, at room temperature, 1.12 eV for Si and 1.42 eV for GaAs) and relatively low breakdown voltages.

Due to this limitation, attention on high-power, high-temperature, and/or high-frequency apparatuses and devices has shifted to a wide bandgap semiconductor material, for example, silicon carbide (for example, 2.996 eV for alpha SiC at room temperature), or Group III nitride (for example, 3.36 eV for GaN at room temperature). These materials typically have a higher electric field breakdown intensity and a higher electron saturation speed than GaAs and Si.

From among Group III-nitride semiconductor devices, for use in high-power and/or high-frequency devices, a device in which semiconductor materials having different bandgap energy levels forms a heterostructure is particularly getting attention. In such a device, a two-dimensional electron gas (2DEG) is formed on a contact surface of two semiconductors, which may provide advantages during operation in a number of events. 2DEG forms a scaling layer in a smaller bandgap material, and may have an excessively high sheet electron concentration, for example, $10^{13}$ carrier/cm$^2$. In addition, electrons generated in a wider bandgap semiconductor material may move to the 2DEG, allowing high electron mobility due to reduced ionized impurity scattering. A combination of a high carrier concentration and a high carrier mobility provides a high-power and high-frequency device having a high performance.

SUMMARY

At least one example embodiment provides high-power nitride-based semiconductor diodes in which nitride-based semiconductors form a heterostructure, and/or integrated devices using the same.

Additional aspects will be set forth in part in the description which follows and, in part, will be apparent from the description, or may be learned by practice of the example embodiments.

According to at least one example embodiment, nitride-based semiconductor diode comprises a substrate, a first semiconductor layer disposed on the substrate, a second semiconductor layer disposed on the first semiconductor layer, the first and second semiconductor layers including a nitride-based semiconductor, and a first portion of the second semiconductor layer having a thickness thinner than a second portion of the second semiconductor layer. The diode may further comprise an insulating layer disposed on the second semiconductor layer, a first electrode covering the first portion of the second semiconductor layer and forming an ohmic contact with the first semiconductor layer and the second semiconductor layer, and a second electrode separated from the first electrode, the second electrode forming an ohmic contact with the first semiconductor layer and the second semiconductor layer.

According to at least one example embodiment, the first portion of the second semiconductor layer has a recess-shape.

According to at least one example embodiment, the second semiconductor layer further includes a third portion that is thicker than the first portion and is thinner than the second portion between an end of the second semiconductor layer contacting the first electrode and the first portion.

According to at least one example embodiment, the second semiconductor layer further includes a fourth portion having a thickness that is substantially identical to a thickness of the second portion between the third portion and the end of second semiconductor layer.

According to at least one example embodiment, the first portion of the second semiconductor layer is provided on an end of the second semiconductor layer and has a step-shape.

According to at least one example embodiment, the first semiconductor layer and the second semiconductor layer form a heterostructure, and a 2-dimensional electron gas is generated in the first semiconductor layer.

According to at least one example embodiment, a discontinuous region of a 2-dimensional electron gas is formed in a portion of the first semiconductor layer which corresponds to the first portion of the second semiconductor layer.

According to at least one example embodiment, if a voltage is applied to the first electrode, then the discontinuous region is filled with electrons and current flows.

According to at least one example embodiment, the first semiconductor layer comprises gallium nitride (GaN), and the second semiconductor layer comprises a nitride-based semiconductor containing aluminum (Al).

According to at least one example embodiment, a nitride-based semiconductor diode includes a substrate; a first semiconductor layer disposed on the substrate; a second semiconductor layer disposed on the first semiconductor layer; a third semiconductor layer disposed on a portion of the second semiconductor layer, the first, second and third semiconductor layers including a nitride-based semiconductor; a first electrode covering the third semiconductor layer and forming an ohmic contact with the first semiconductor layer and the second semiconductor layer; and a second electrode spaced apart from the first electrode and forming an ohmic contact with the first semiconductor layer and the second semiconductor layer.

According to at least one example embodiment, the third semiconductor layer is spaced apart from an end of the second semiconductor layer, and the second semiconductor layer includes a first portion between the third semiconductor layer and the end of the second semiconductor layer, and a thickness of the first portion is thinner than a thickness of the other portion of the second semiconductor layer.

According to at least one example embodiment, the third semiconductor layer includes a first portion spaced apart from an end of the second semiconductor layer and a second portion extending from the first portion to the end of the second semiconductor, and a thickness of the second portion is smaller than a thickness of the first portion According to at least one example embodiment, the semiconductor diode of further comprises an insulating layer on the second semiconductor layer and the third semiconductor layer.

According to at least one example embodiment, a portion of the insulating layer has an opening, the opening exposing a portion of the third semiconductor layer, and the first electrode contacts the third semiconductor layer through the opening.

According to at least one example embodiment, the first semiconductor layer and the second semiconductor layer form a heterostructure, and a 2-dimensional electron gas is generated in the first semiconductor layer.

According to at least one example embodiment, a discontinuous region of a 2-dimensional electron gas is formed in a portion of the first semiconductor layer which corresponds to the third semiconductor layer.

According to at least one example embodiment, if a voltage is applied to the first electrode, then the discontinuous region is filled with electrons, and current flows.

According to at least one example embodiment, the first semiconductor layer comprises gallium nitride (GaN), and the second semiconductor layer comprises a nitride-based semiconductor containing aluminum (Al).

According to at least one example embodiment, the third semiconductor layer includes a gallium nitride (GaN) doped with a P-type impurity.

According to at least one example embodiment, a nitride-based semiconductor integrated device comprises a substrate; a first semiconductor layer disposed on the substrate; a second semiconductor layer disposed on the first semiconductor layer, the first and second semiconductor layers including a nitride-based semiconductor, and the second semiconductor layer having a first portion and a second portion, each of the first portion and the second portion having a thickness that is less than that of a remaining portion of the second semiconductor layer; an insulating layer disposed on the second semiconductor layer; a first electrode covering the first portion and forming an ohmic contact with the first semiconductor layer and the second semiconductor layer; a gate electrode spaced apart from the first electrode and disposed on the second portion; and a second electrode and a third electrode, each of which is disposed on an end of the first semiconductor layer and forms an ohmic contact with the first semiconductor layer and the second semiconductor layer.

According to at least one example embodiment, the first semiconductor layer comprises gallium nitride (GaN), and the second semiconductor layer comprises a nitride-based semiconductor containing aluminum (Al).

According to at least one example embodiment, the nitride-based semiconductor integrated device comprises at least one diode and at least one transistor, and the at least one diode is connected to the at least one transistor in series or in parallel.

According to at least one example embodiment, a nitride-based semiconductor integrated device comprises a substrate; a first semiconductor layer disposed on the substrate; a second semiconductor layer disposed on the first semiconductor layer; a third semiconductor layer and a fourth semiconductor layer, each of which is disposed on a portion of the second semiconductor layer, the first, second, third and fourth semiconductor layers including a nitride-based semiconductor; a first electrode covering the third semiconductor layer and forming an ohmic contact with the first semiconductor layer and the second semiconductor layer; a gate electrode spaced apart from the first electrode and disposed on the fourth semiconductor layer; and a second electrode and a third electrode, each of which is disposed on an end of the first semiconductor layer and forms an ohmic contact with the first semiconductor layer and the second semiconductor layer.

According to at least one example embodiment, further comprising an insulating layer disposed on the second semiconductor layer.

According to at least one example embodiment, the first semiconductor layer comprises gallium nitride (GaN), and the second semiconductor layer comprises a nitride-based semiconductor containing aluminum (Al).

According to at least one example embodiment, each of the third semiconductor layer and the fourth semiconductor layer comprises gallium nitride (GaN) doped with a P-type impurity.

According to at least one example embodiment, the nitride-based semiconductor integrated device comprises at least one diode and at least one transistor, and the at least one diode is connected to the at least one transistor in series or in parallel.

According to at least one example embodiment, a diode comprises a substrate; a first semiconductor layer on the substrate; and a second semiconductor layer on the first semiconductor layer, the first and second semiconductor layers being nitride-based semiconductor layers, the second semiconductor layer including a recess, a location of the recess corresponding to a region of the first semiconductor layer having a carrier concentration controlled according to at least one of a depth and a width of the recess.

According to at least one example embodiment, the diode further comprises an insulating layer on the second semiconductor layer and conforming to the recess; a first electrode on the insulating layer and in the recess, the first electrode being in ohmic contact with the first and second semiconductor layers; and a second electrode separated from the first electrode, the second electrode being in ohmic contact with the first and second semiconductor layers.

According to at least one example embodiment, the first and second semiconductor layers are formed of a material such that a 2-dimensional electron gas is generated in the first semiconductor layer if a voltage is applied to the diode.

According to at least one example embodiment, the carrier concentration in the first semiconductor layer is controlled according to an aluminum concentration in the second semiconductor layer.

According to at least one example embodiment, the first electrode is an anode of the diode and the second electrode is a cathode of the diode.

BRIEF DESCRIPTION OF THE DRAWINGS

These and/or other aspects will become apparent and more readily appreciated from the following description of the example embodiments, taken in conjunction with the accompanying drawings in which:

FIG. 14 is a schematic cross-sectional view of a nitride-based semiconductor integrated device according to at least one example embodiment.

DETAILED DESCRIPTION OF EXAMPLE EMBODIMENTS

Figure 1A:
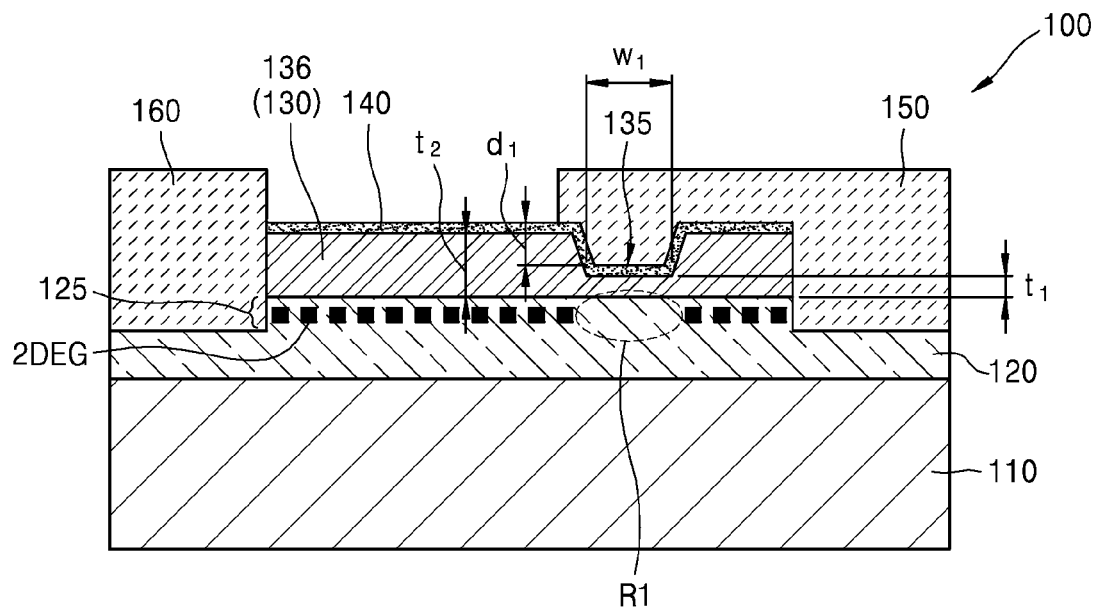
FIG. 1A is a schematic cross-sectional view of a nitride-based semiconductor diode according to at least one example embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed. Expressions such as "at least one of," when preceding a list of elements, modify the entire list of elements and do not modify the individual elements of the list.

The inventive concepts may have different forms and should not be construed as limited to the exemplary embodiments set forth herein. For example, it will also be understood that when a layer is referred to as being "on" another layer or a substrate, it can be directly on the other layer or the substrate, or intervening layers may also be present therebetween.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the example embodiments.

Unless otherwise defined, all terms (including technical and scientific terms) used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and spatially relative descriptors used herein interpreted accordingly.

The term "layer" used herein refers to a part of a structure formed by stacking objects. Accordingly, the meaning of the term "layer" should not be confined by thicknesses of the objects.

The inventive concepts will now be described more fully with reference to the accompanying drawings, in which exemplary embodiments are shown. In the drawings, the same reference numerals denote the same elements, and sizes of elements may be exaggerated for clarity.

FIG. 1A is a schematic cross-sectional view of a nitride-based semiconductor diode 100 according to at least one example embodiment.

Referring to FIG. 1A, the nitride-based semiconductor diode 100 includes a substrate 110, a first semiconductor layer 120 that is disposed on the substrate 110 and is formed of a nitride-based semiconductor, a second semiconductor layer 130 that is disposed on the first semiconductor layer 120, is formed of a nitride-based semiconductor, and has a portion 135 having a thickness thinner than the other portion of the second semiconductor layer 130, an insulating layer 140 disposed on the second semiconductor layer 130, a first electrode 150 that covers the portion 135 and forms an ohmic contact with the first semiconductor layer 120 and the second semiconductor layer 130, and a second electrode 160 that is separated from the first electrode 150 and forms an ohmic contact with the first semiconductor layer 120 and the second semiconductor layer 130.

The substrate 110 is required in a thin film growth process, and may be a silicon (Si) substrate, a silicon carbide (SiC) substrate, a sapphire ($Al_2O_3$) substrate, a GaN substrate, or a $Ga_2O_3$ substrate. The substrate 110 may be formed by doping impurities. When the substrate 110 is a silicon substrate, the substrate 110 may be doped with a p-type or n-type impurity. A p-type impurity may include, for example, at least one selected from the group consisting of B, Al, Mg, Ca, Zn, Cd, Hg, and Ga, and an n-type impurity may include, for example, at least one selected from the group consisting of As and P.

A nucleation layer and/or various buffer layers may be formed between the substrate 110 and the first semiconductor layer 120 to reduce (or alternatively, prevent) crystal defects caused by mismatch of lattice constants and thermal expansion coefficients of the substrate 110 and the first semiconductor layer 120. For example, the nucleation layer or buffer layers may have a single-layer or multi-layer structure including at least one material selected from nitrides including at least one of Al, Ga, In, and B. According to at least one example embodiment, the nucleation layer or buffer layers may have a single- or multi-layer structure including SiC.

The first semiconductor layer 120 may be a semiconductor layer formed of a nitride. For example, the first semiconductor layer 120 may include a GaN-based material. In this regard, the first semiconductor layer 120 may be an undoped GaN layer. However, in some cases, the first semiconductor layer 120 may be a GaN layer doped with certain impurities. A thickness of the first semiconductor layer 120 may be several tens of nanometers or less.

The second semiconductor layer 130 is disposed on the first semiconductor layer 120 and may have a recess. The second semiconductor layer 130 may be a semiconductor layer formed of a material that is different from that of the first semiconductor layer 120.

Typically, a 2 dimensional electron gas (2DEG) that has a very small resistance loss and enables delivery of a very high current density may be generated in nitride semiconductors that form a heterostructure. A 2DEG is generated due to an interior electric field caused by a lattice constant difference, a conductive band difference, and/or polarization of semiconductor materials that forms the heterostructure. In addition, an interior electric field caused by polarization may be induced from a piezoelectric effect due to a mismatch of a lattice constant stemming from the heterostructure and a voluntary polarization of atoms.

The second semiconductor layer 130 may be a layer inducing the formation of a 2-DEG layer 125 in the first semiconductor layer 120. That is, the second semiconductor layer 130 may include a semiconductor that is different from that of the first semiconductor layer 120 in terms of at least one of polarization characteristics, an energy bandgap, and a lattice constant. For example, the second semiconductor layer 130 may include a semiconductor having a greater polarization rate and/or energy bandgap than that of the first semiconductor layer 120. According to at least one example embodiment, the second semiconductor layer 130 may have a single-layer or multi-layer structure including at least one material selected from nitrides including at least one of Al, Ga, In, and B. For example, the second semiconductor layer 130 may have a single-layer or multi-layer structure including at least one material selected from AlGaN, AlInN, InGaN, AlN, and AlInGaN. The second semiconductor layer 130 may be an undoped layer. In some cases, however, the second semiconductor layer 130 may be a layer doped with certain impurities. A thickness of the second semiconductor layer 130 may be several tens of nanometers or less. Also, the 2-dimensional electron gas layer 125 formed by contacting the first semiconductor layer 120 with the second semiconductor layer 130 may be a current flow pathway of the nitride-based semiconductor diode 100.

The portion 135 may be included in the second semiconductor layer 130. In the case of the nitride-based semiconductor diode illustrated in FIG. 1, the portion 135 may have a recess-shape. The portion 135 is provided to make a region of the second semiconductor layer 130 have a thickness t1 that is smaller than the other region of the second semiconductor layer 130 having a thickness t2.

Due to adjusting of the thickness of the second semiconductor layer 130, the carrier concentration in the 2-DEG layer 125 induced in the first semiconductor layer 120 is controllable. When the thickness of the second semiconductor layer 130 is small, the carrier concentration in the 2-DEG layer 125 may decrease, or not be formed. That is, the 2-DEG layer 125 may have a discontinuous region R1 of the 2-DEG. The size of the discontinuous region R1 may depend on a depth d1 of the portion 135 that determines the thickness of the second semiconductor layer 130 and a width w1 of the portion 135. In addition, the size of the discontinuous region R1 may depend on the concentration of aluminum (Al) that constitutes the second semiconductor layer 130.

The insulating layer 140 may be provided on the second semiconductor layer 130. The insulating layer 140 may include an insulating material, for example, silicon, silicon oxide, silicon nitride, or silicon oxynitride. Also, the insulating layer 140 may be a composite layer of a silicon oxide layer and a silicon nitride layer, or may be a silicon oxide layer that includes a nitrided silicon oxide layer therein.

The insulating layer 140 may mitigate (or alternatively, prevent) the formation of an ohmic contact between the portion 135 of the second semiconductor layer 130 and the first electrode 150. The insulating layer 140 may protect the second semiconductor layer 130. For example, when the first electrode 150 and the second electrode 160 are formed and then heat treated, any damage to the second semiconductor layer 130 due to the heat treatment may be mitigated (or alternatively, prevented). Also, the insulating layer 140 may improve surface leakage current characteristics. For example, the insulating layer 140 may suppress the flow of leakage current through the recess region.

The first electrode 150 may form an ohmic contact between the first semiconductor layer 120 and the second semiconductor layer 130, covering the portion 135. The second electrode 160 may be spaced apart from the first electrode 150, and may form an ohmic contact between the first semiconductor layer 120 and the second semiconductor layer 130. In this case, the first electrode 150 and the second electrode 160 may each include a conductive material, for example, metal, a metal alloy, a conductive metal oxide, or a conductive metal nitride. For example, the first electrode 150 and the second electrode 160 may each include at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The first electrode 150 and the second electrode 160 may each have a single-layer or multi-layered structure.

The first electrode 150 and the second electrode 160 may be electrically connected to the 2-DEG layer 125. For example, portions of the second semiconductor layer 130 and the first semiconductor layer 120 are etched, and then, the first electrode 150 and/or the second electrode 160 may be formed on the etched region. In this regard, a depth of the etched region may be greater than that of the 2-DEG layer 125. Accordingly, the first electrode 150 and the second electrode 160 may directly contact a side surface of the 2-DEG layer 125. This structure, however, is an example only. According to another example embodiment, only a portion of the second semiconductor layer 130 is etched, and then, the first electrode 150 and/or the second electrode 160 are formed. According to yet another example embodiment, without etching, the first electrode 150 and/or the second electrode 160 may be formed on a top surface of the second semiconductor layer 130.

When a voltage is applied to the first electrode 150, an interior electric field is formed in the first semiconductor layer 120 and the second semiconductor layer 130 and the discontinuous region R1 of the 2-DEG layer 125 may be filled with electrons. In this case, the current may flow through the discontinuous region R1 and the current may flow from the first electrode 150 to the second electrode 160. However, when a voltage is applied to the second electrode 160, the discontinuous region R1 may lose electrons. Accordingly, a forward current flow from the first electrode 150 to the second electrode 160 may be allowed, and a reverse current flow from the second electrode 160 to the first electrode 150 is blocked. Thus, in the nitride-based semiconductor diode 100, the first electrode 150 may correspond to an anode and the second electrode 160 may correspond to a cathode.

Figure 1B:
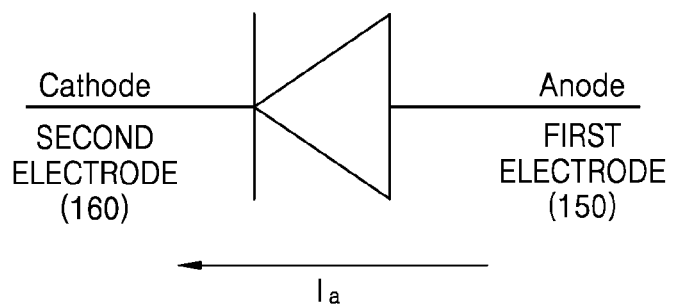
FIGS. 1B and 1C are circuit diagrams illustrating how the nitride-based semiconductor diode of FIG. 1A operates.
Figure 1C:
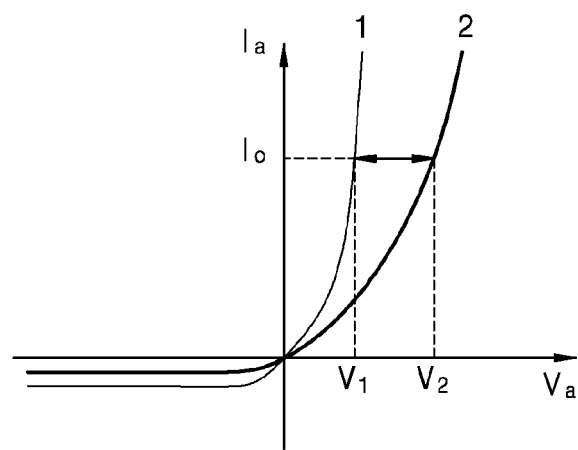

FIGS. 1B and 1C are circuit diagrams illustrating how the nitride-based semiconductor diode of FIG. 1A operates.

Referring to FIGS. 1B and 1C, according to an intensity of a voltage Va applied to an anode, a forward current Ia flowing in the nitride-based semiconductor diode 100 may rapidly increase. A slope of the forward current Ia with respect to the voltage Va may depend on the size of the discontinuous region R1 of the 2-DEG layer 125 and the carrier concentration in the discontinuous region R1.

Since the discontinuous region R1 of the nitride-based semiconductor diode 100 depends on the size of the portion 135, the slope of the forward current Ia may also depend on the size of the portion 135. For example, when the depth d1 of the portion 135 is relatively large and the thickness t1 of the second semiconductor layer 130 decreases, a turn-on voltage of the nitride-based semiconductor diode 100 may increase from $V_1$ to $V_2$. On the other hand, the depth d of the portion 135 is relatively small, a turn-on voltage of the nitride-based semiconductor diode 100 may decrease from $V_2$ to $V_1$. According to another example embodiment, when the width w1 of the portion 135 increases, the turn-on voltage may increase from $V_1$ to $V_2$. The turn-on voltage may be controlled within, for example, a range of −4V to 2V.

In addition, in the nitride-based semiconductor diode 100, the size of the discontinuous region R1 may depend on the concentration of aluminum (Al) included in the second semiconductor layer 130. For example, when the concentration of Al increases, the turn-on voltage may be reduced from V2 to V1.

Figure 2:
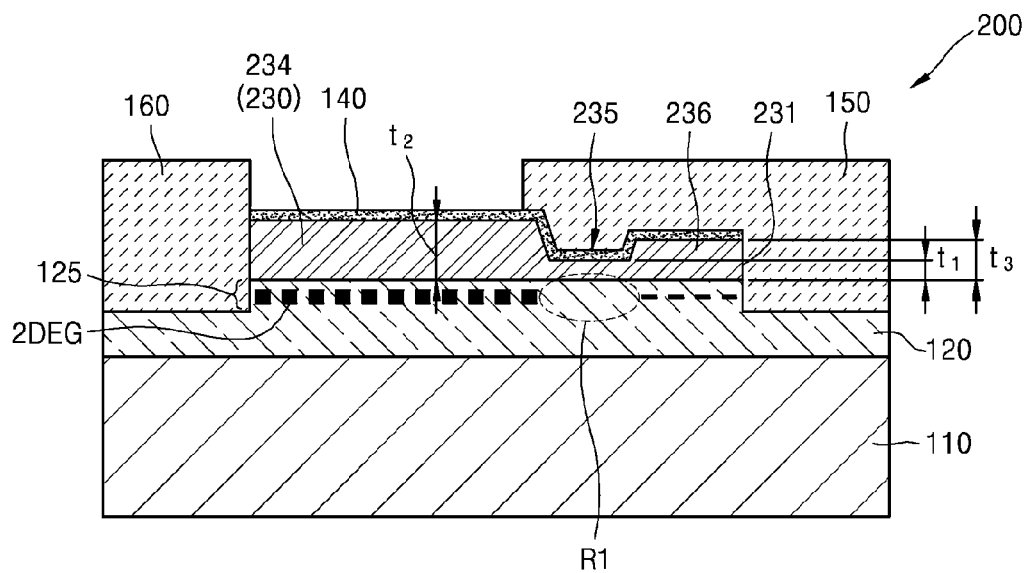
FIG. 2 is a schematic cross-sectional view of a nitride-based semiconductor diode according to at least one example embodiment.

FIG. 2 is a schematic cross-sectional view of a nitride-based semiconductor diode 200 according to at least one example embodiment.

Referring to FIG. 2, the nitride-based semiconductor diode 200 is different from the nitride-based semiconductor diode 100 in the structure of a second semiconductor layer 230, and constituents of the nitride-based semiconductor diode 200 which are substantially the same as those of the nitride-based semiconductor diode 100 are denoted by the same reference numerals as in the nitride-based semiconductor diode 100, and detailed description thereof are omitted.

The second semiconductor layer 230 includes a first portion 235 having a first thickness t1, a second portion 234 having a second thickness t2, and a third portion 236 having a third thickness t3. The third portion 236 is disposed between an end 231 of the second semiconductor layer 230 which contacts the first electrode 150 and the second portion 236. The third thickness t3 may be greater than the first thickness t1 and smaller than the second thickness t2.

In FIG. 2, the 2DEG is illustrated such that when an electron concentration is relatively high, the 2DEG is indicated as thicker dots, and when an electron concentration is relatively low, the 2DEG is indicated as thinner dots. The thicker dots, the higher electron concentration. A region in which 2DEG is not illustrated is a discontinuous region of 2DEG.

A 2DEG region disposed under the second portion 234 has a relatively high electron concentration, a 2DEG region disposed under the first portion 235 is a discontinuous region R1, and a 2DEG region disposed under the third portion 236 has a relatively low electron concentration.

The nitride-based semiconductor diode 200 may have a lower turn-on voltage than the nitride-based semiconductor diode 100.

Figure 3:
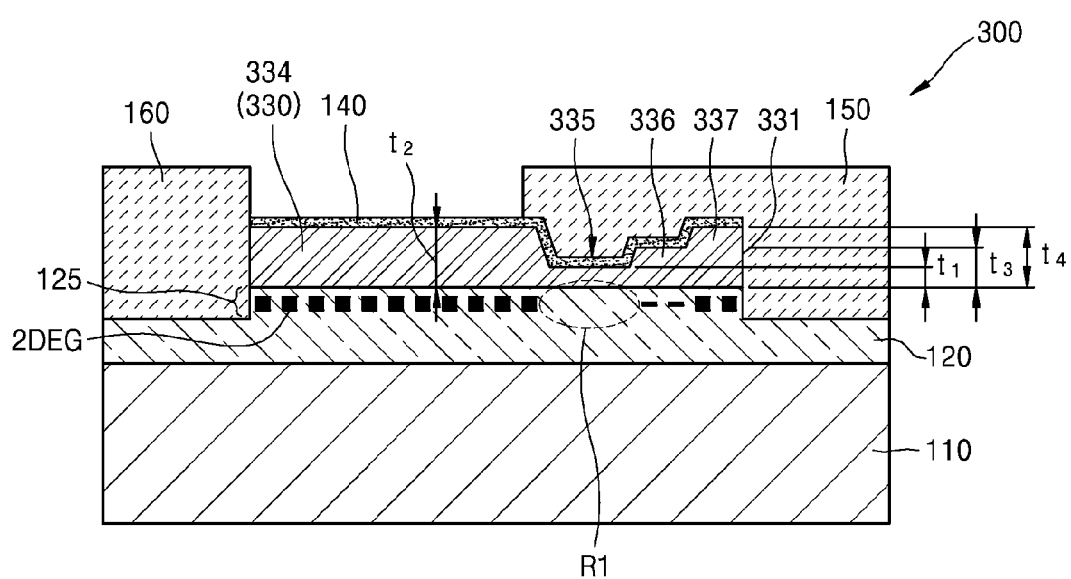
FIG. 3 is a schematic cross-sectional view of a nitride-based semiconductor diode according to at least one example embodiment.

FIG. 3 is a schematic cross-sectional view of a nitride-based semiconductor diode 300 according to at least one example embodiment.

Referring to FIG. 3, the nitride-based semiconductor diode 300 is different from the nitride-based semiconductor diode 100 in the structure of a second semiconductor layer 330, and constituents of the nitride-based semiconductor diode 300 which are substantially the same as those of the nitride-based semiconductor diode 100 are denoted by the same reference numerals as in the nitride-based semiconductor diode 100, and detailed description thereof are omitted.

The second semiconductor layer 330 includes a first portion 335 having a first thickness t1, a second portion 334 having a second thickness t2, a third portion 336 having a third thickness t3, and a fourth portion 337 having a fourth thickness t4. The third portion 336 and the fourth portion 337 is disposed between an end 331 of the second semiconductor layer 330 which contacts the first electrode 150 and the second portion 336. The third thickness t3 may be thicker than the first thickness t1 and may be smaller than the second thickness t2. The fourth thickness t4 may be substantially the same as the second thickness t2.

In FIG. 3, the 2DEG is illustrated such that when an electron concentration is relatively high, the 2DEG is indicated as thicker dots, and when an electron concentration is relatively low, the 2DEG is indicated as thinner dots. The thicker dots, the higher electron concentration. A region in which 2DEG is not illustrated is a discontinuous region of 2DEG.

A 2DEG region disposed under the second portion 334 and the fourth portion 337 has a relatively high electron concentration, a 2DEG region disposed under the first portion 335 is a discontinuous region R1, and a 2DEG region disposed under the third portion 336 has a relatively low electron concentration.

The nitride-based semiconductor diode 300 may have a lower turn-on voltage than the nitride-based semiconductor diode 100.

Figure 4:
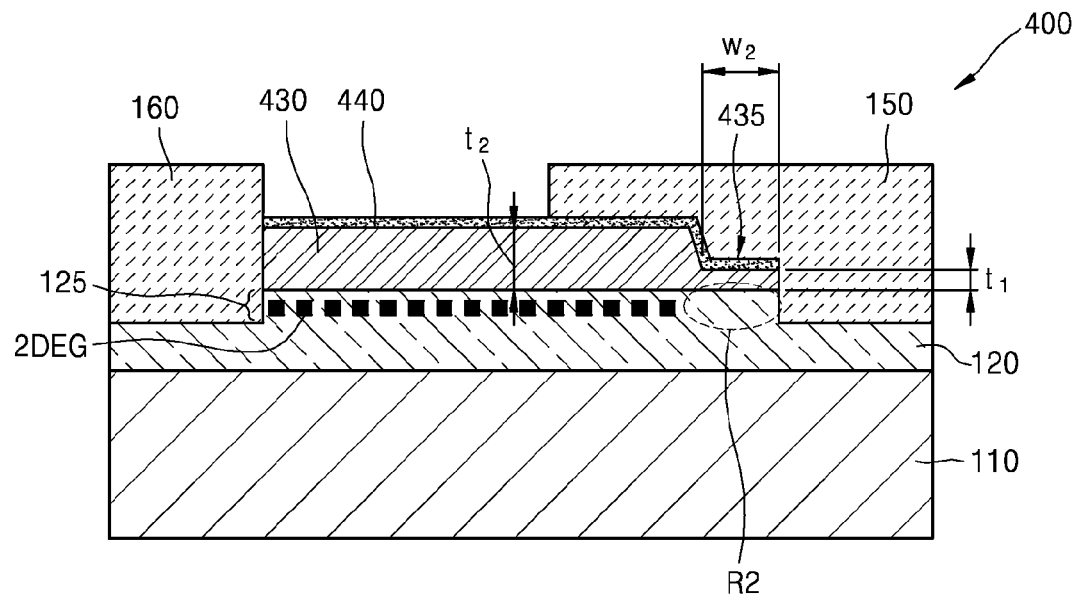
FIG. 4 is a schematic cross-sectional view of a nitride-based semiconductor diode according to at least one example embodiment.

FIG. 4 is a schematic cross-sectional view of a nitride-based semiconductor diode 400 according to at least one example embodiment.

Referring to FIG. 4, the nitride-based semiconductor diode 400 includes the substrate 110, the first semiconductor layer 120 that is disposed on the substrate 110 and is formed of a nitride-based semiconductor, a second semiconductor layer 230 that is disposed on the first semiconductor layer 120, is formed of a nitride-based semiconductor, and has a portion 435 having a thickness thinner than the other portion of the second semiconductor layer 430, an insulating layer 440 disposed on the second semiconductor layer 430, the first electrode 150 that covers the portion 435 and forms an ohmic contact with the first semiconductor layer 120, and the second electrode 160 that is separated from the first electrode 150 and forms an ohmic contact with the first semiconductor layer 120.

Referring to FIG. 4, the portion 235 includes a step. The portion 235 has a thickness t1 that is thinner than the other portion of the second semiconductor layer 230 having a thickness t2. When the portion 235 includes a step, a width w2 of the step is easily controlled. A contact resistance is corrected by controlling the width w2 of the step. The width w2 of the step may be, for example, several tens of micrometers or less.

The first semiconductor layer 120 has a discontinuous region R2, which is a region in which 2DEG is not present, under the first portion 435.

Figure 5:
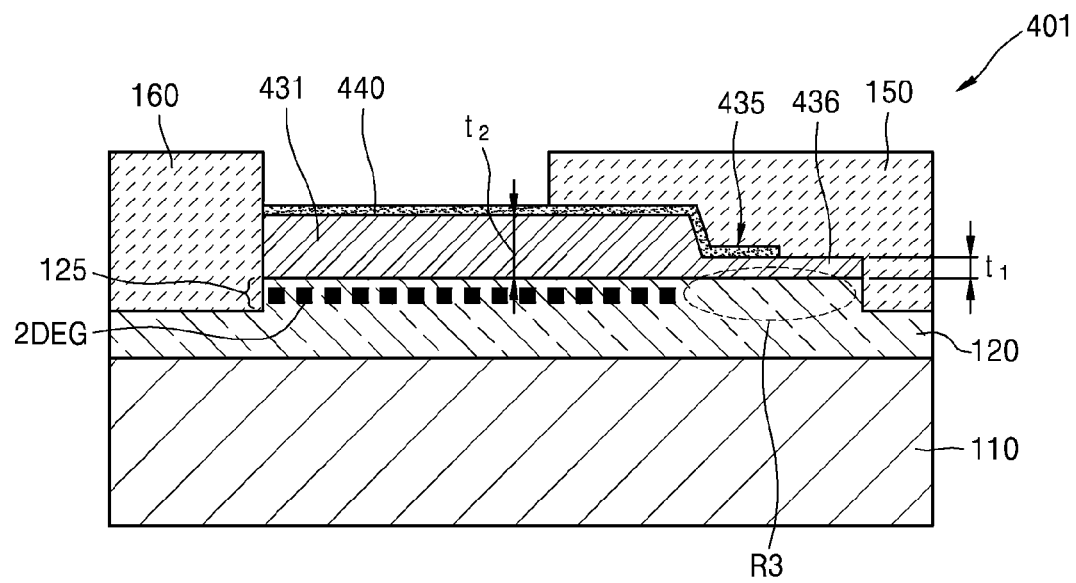
FIG. 5 is a schematic cross-sectional view of a nitride-based semiconductor diode according to at least one example embodiment.

FIG. 5 is a schematic cross-sectional view of a nitride-based semiconductor diode 401 according to at least one example embodiment. The nitride-based semiconductor diode 401 of FIG. 5 has an extension portion 436 formed by extending the first portion 435 of the second semiconductor layer 430 in comparison with the nitride-based semiconductor diode 400 of FIG. 4. Constituents of the nitride-based semiconductor diode 401 of FIG. 5 which are substantially the same as those of the nitride-based semiconductor diode 400 of FIG. 4 are denoted by the same reference numerals as in the nitride-based semiconductor diode 400, and detailed description thereof are omitted.

Referring to FIG. 5, a second semiconductor layer 431 includes the first portion 435 that is thinner than the other part of the second semiconductor layer 431 and the extension portion 436 extending from the first portion 435 to an end of the second semiconductor layer 431. The insulating layer 440 covers the second semiconductor layer 431 other than the extension portion 436.

The first electrode 150 covers a top surface and a side surface of the extension portion 436 which are exposed by the insulating layer 440 and forms an ohmic contact with the first semiconductor layer 120.

The first portion 435 and the extension portion 436 have a step shape. A thickness t1 of the first portion 435 and the extension portion 436 may be smaller than a thickness t2 of the other region of the second semiconductor layer 430. A discontinuous region R3, in which 2DEG is not present, may be formed under the first portion 435 and the second portion 436.

The extension portion 436 may contribute to an increase in a contact area with the first electrode 150, thereby reducing a contact resistance of the first electrode 150.

Also, when the thickness t1 of the first portion 435 and the extension portion 436 increases, 2DEG may be slightly formed under the first portion 435 and the second portion 436. When a forward current is applied, a turn-on voltage may decrease. When a reverse current is applied, electrons of 2DEG slightly formed in the first portion 435 and the second portion 436 may be depleted, and thus, the current does not flow.

FIGS. 6A to 6D are cross-sectional views schematically illustrating a method of manufacturing the nitride-based semiconductor diode 100 of FIG. 1A. Constituents illustrated in FIGS. 6A and 6D which are substantially the same as those illustrated in FIG. 1A are denoted by the same reference numerals as in FIG. 1A, and detailed description thereof are omitted.

Figure 6A:
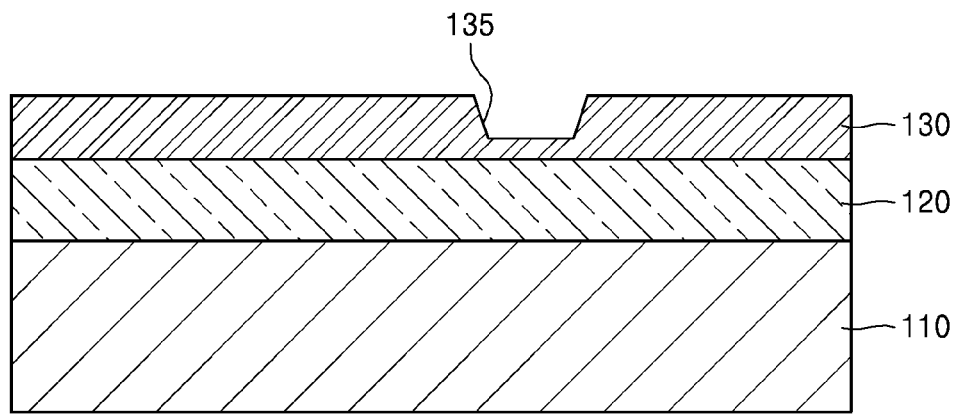
FIGS. 6A to 6D are cross-sectional views schematically illustrating a method of manufacturing the nitride-based semiconductor diode of FIG. 1A.

Referring to FIG. 6A, the first semiconductor layer 120 and the second semiconductor layer 130 may be formed on the substrate 110. The first semiconductor layer 120 and the second semiconductor layer 130 may be formed by using various methods that are typically known as a compound semiconductor growth method. For example, epitaxial deposition, metal organic chemical vapor deposition (MOCVD), hydride vapor phase epitaxy (HVPE), molecular beam epitaxy (MBE), metal organic vapor phase epitaxy (MOVPE), and halide chemical vapor deposition (HCVD) may be used.

Various buffer layers may be formed between the substrate 110 and the first semiconductor layer 120 to mitigate (or alternatively, prevent) a decrease in crystallinity of the first semiconductor layer 120 to reduce a lattice constant difference and a thermal expansion coefficient difference of the substrate 110 and the first semiconductor layer 120. These buffer layers may be formed by using various methods that are typically known as a compound semiconductor growth method.

After the second semiconductor layer 130 is formed, a recess 135 may be formed in a region of the second semiconductor layer 130. The recess 135 may be formed by using an etching process with a patterned mask. For example, the etching process may be a wet process in which a strong acid, such as KOH, and an ultraviolet (UV) rays are used. As another example, the etch process may be a dry process, such as an inductively coupled plasma etching using $Cl_2$, $BCl_3$, $CCl_2F_2$ and/or other chlorides, or a reactive ion etching, such as electron cyclotron resonance and/or downstream plasma etching in which a DC element is not present in plasma.

Figure 6B:
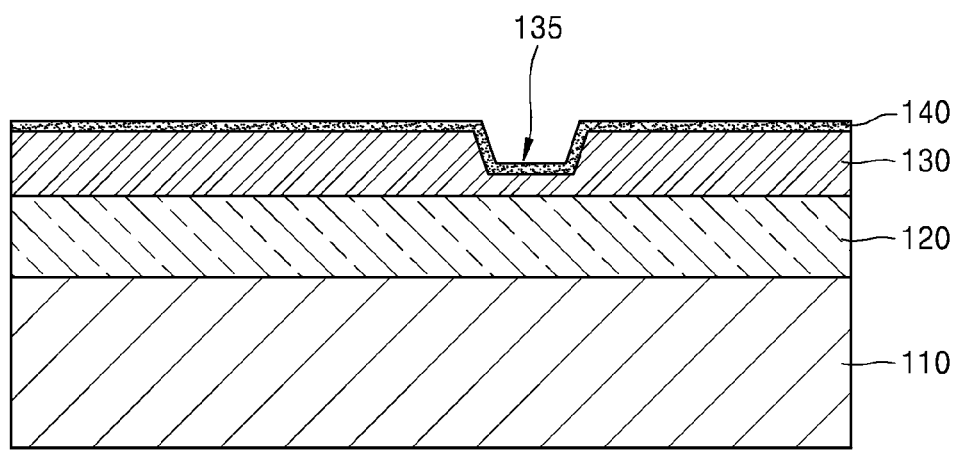

Referring to FIG. 6B, the insulating layer 140 may be formed on the second semiconductor layer 130. The insulating layer 140 may include an insulating material, for example, silicon, silicon oxide, silicon nitride, or silicon oxynitride. The insulating layer 140 may be formed by using various deposition methods. Also, the insulating layer 140 may be a composite layer of a silicon oxide layer and a silicon nitride layer, or may be a silicon oxide layer that includes a nitrided silicon oxide layer therein. The nitriding may be performed by, for example, annealing using nitrogen-containing gas, such as $NH_3$ gas, rapid thermal annealing (RTA), or laser RTA. In addition, the nitriding may be performed by plasma nitriding, plasma ion implantation, plasma-enhanced chemical vapor deposition (PECVD), high density plasma chemical vapor deposition (HDP-CVD), or radical nitriding. Following the nitriding, the resultant structure is heat treated in an inert atmosphere containing an inert gas, such as helium or argon.

Figure 6C:
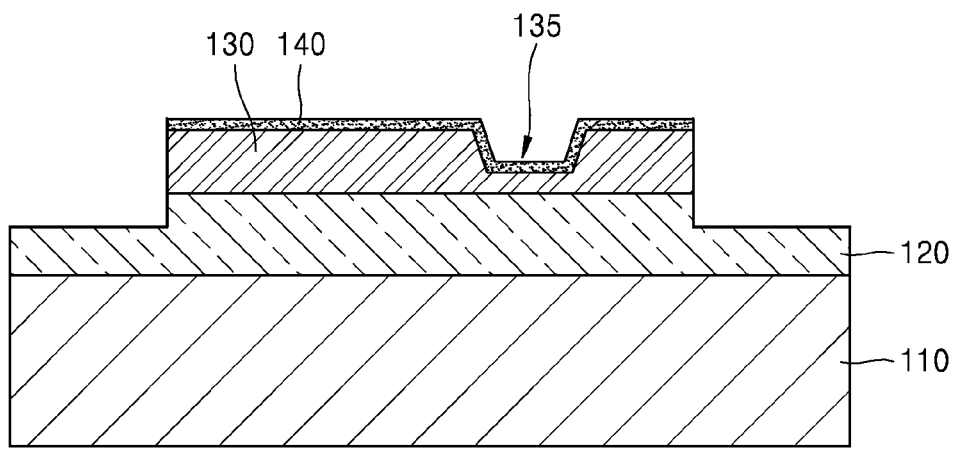

Referring to FIG. 6C, to form the first electrode 150 and the second electrode 160 on both ends of the first semiconductor layer 120, both ends of the second semiconductor layer 130 are removed using an etching process. For example, the etching process may be a wet process in which a strong acid, such as KOH, and UV rays are used. As another example, the etch process may be a dry process, such as an inductively coupled plasma etching using $Cl_2$, $BCl_3$, $CCl_2F_2$ and/or other chlorides, or a reactive ion etching, such as electron cyclotron resonance and/or downstream plasma etching in which a DC element is not present in plasma. The etching process for forming an electrode may be performed up to portions of both ends of the first semiconductor layer 120. However, this is an example only, and the recess may be formed only in the second semiconductor layer 130.

Figure 6D:
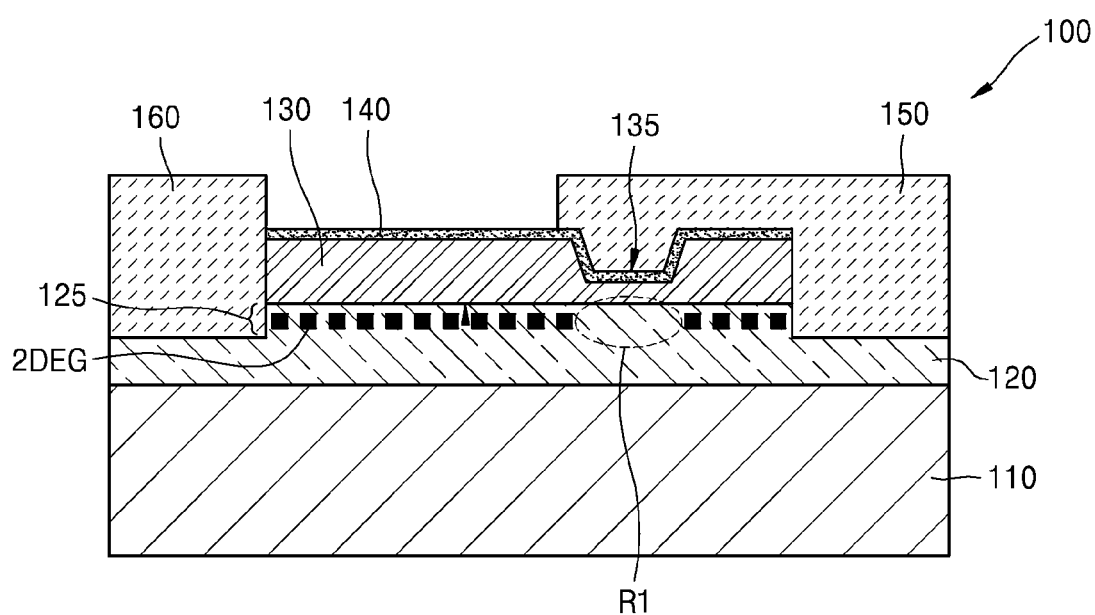

Referring to FIG. 6D, the first electrode 150 and the second electrode 160 for applying a voltage to the nitride-based semiconductor diode 100 may be formed. The first electrode 150 and the second electrode 160 may each include a conductive material, for example, metal, metal alloy, conductive metal oxide, or conductive metal nitride. The first electrode 150 and the second electrode 160 may each be formed by chemical vapor deposition (CVD), plasma-enhanced CVD, PECVD, low pressure CVD, LPCVD, physical vapor deposition (PVD), sputtering, or atomic layer deposition (ALD). The first electrode 150 and the second electrode 160 may form an ohmic contact, and may be simultaneously formed.

The nitride-based semiconductor diodes of FIGS. 2 to 5 are different from the nitride-based semiconductor diode of FIG. 1A in the structure of a second semiconductor layer, and a method of manufacturing the nitride-based semiconductor diodes of FIGS. 2 to 5 may be obvious by referring to a method of manufacturing a nitride-based semiconductor diode illustrated in FIGS. 6A to 6D. Accordingly, detailed description will be omitted.

Figure 7:
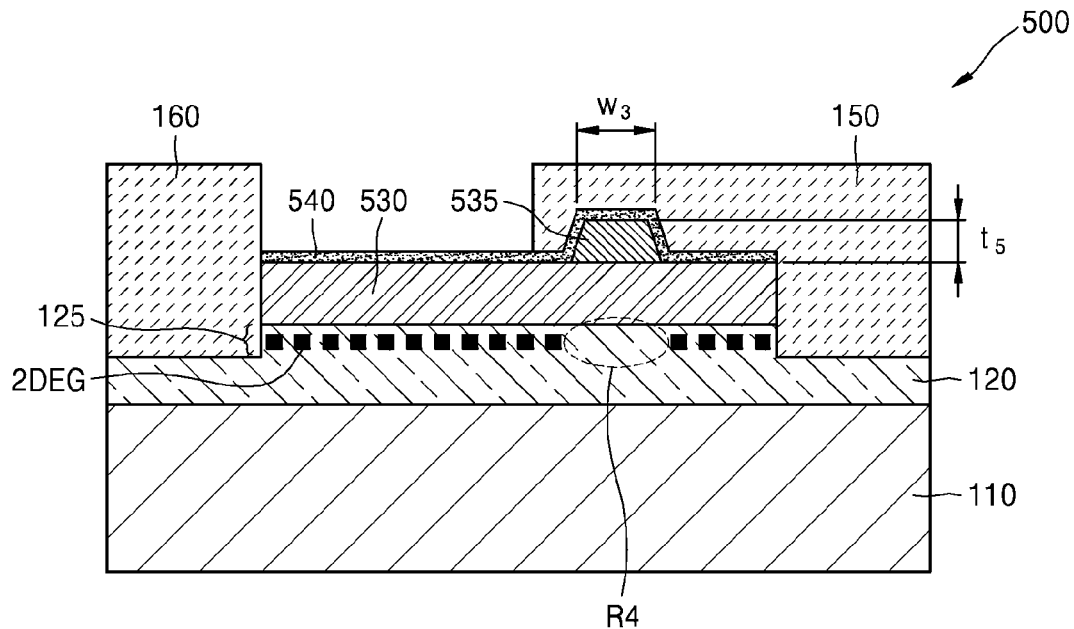
FIG. 7 is a schematic view of a nitride-based semiconductor diode according to at least one example embodiment.

FIG. 7 is a schematic view of a nitride-based semiconductor diode 500 according to at least one example embodiment.

Referring to FIG. 7, the nitride-based semiconductor diode 500 includes the substrate 110, the first semiconductor layer 120 that is disposed on the substrate 110 and is formed of a nitride-based semiconductor, a second semiconductor layer 530 that is disposed on the first semiconductor layer 120 and is formed of a nitride-based semiconductor, a third semiconductor layer 535 that is disposed on a portion of the second semiconductor layer 530 and is formed of a nitride-based semiconductor, the first electrode 150 that covers the third semiconductor layer 535 and forms an ohmic contact with the first semiconductor layer 120 and the second semiconductor layer 530, and the second electrode 160 that is spaced from the first electrode 150 and forms an ohmic contact with the first semiconductor layer 120 and the second semiconductor layer 530. In addition, the nitride-based semiconductor diode 500 may further include an insulating layer 540 disposed on the second semiconductor layer 530 and the third semiconductor layer 535.

The nitride-based semiconductor diode 500 of FIG. 7 is different from the nitride-based semiconductor diode 100 of FIG. 1A in that the second semiconductor layer 530 does not have a recess and the third semiconductor layer 535 is formed on a portion of the second semiconductor layer 530.

The third semiconductor layer 435 may control the carrier concentration in the 2-DEG layer 125 induced in the first semiconductor layer 120. In this case, a thickness of the second semiconductor layer 530 may be in a range of about 6 nm to about 25 nm.

According to the presence or absence of the third semiconductor layer 535, the carrier concentration in the 2-DEG layer 125 may increase or decrease, or not be formed. That is, the 2-DEG layer 125 may have a discontinuous region R4 of the 2-DEG. The size of the discontinuous region R4 may depend on a material that forms the third semiconductor layer 535, a thickness t5 of the third semiconductor layer 535, and/or a width w3 of the third semiconductor layer 535. In addition, the size of the discontinuous region R4 may depend on the concentration of aluminum (Al) included in the second semiconductor layer 530. The third semiconductor layer 535 may include a p-type doped gallium nitride (GaN). As a p-type impurity, Mg, Fe, Cr, or Zn may be used.

When a voltage is applied to the first electrode 150, an interior electric field is formed in the first semiconductor layer 120 and the second semiconductor layer 130 and the discontinuous region R4 of the 2-DEG may be filled with electrons. In this case, the flow of electrons through the discontinuous region R4 is allowed, and a current flows from the first electrode 150 to the second electrode 160. However, when a voltage is applied to the second electrode 160, the discontinuous region R4 may lose electrons. Accordingly, a forward current flow from the first electrode 150 to the second electrode 160 may be allowed, and a reverse current flow from the second electrode 160 to the first electrode 150 is blocked. Thus, in the nitride-based semiconductor diode 100, the first electrode 150 may correspond to an anode and the second electrode 160 may correspond to a cathode.

In the nitride-based semiconductor diode 500, the discontinuous region R4 may be controllable by using the third semiconductor layer 535, and accordingly, a slope of the forward current may be controllable by the third semiconductor layer 535. For example, when the thickness t5 of the third semiconductor layer 535 increases, a turn-on voltage of the nitride-based semiconductor diode 500 may increase. As another example, when the width w3 of the third semiconductor layer 535 increases, the turn-on voltage may increase. Also, when the third semiconductor layer 535 includes p-GaN, the turn-on voltage may vary according to the concentration of the p-type impurity. For example, an increase in the concentration of the p-type impurity may lead to a higher turn-on voltage of the nitride-based semiconductor diode 500.

The nitride-based semiconductor diode 500 may additionally include the insulating layer 540. The insulating layer 540 may be disposed on the second semiconductor layer 530 and the third semiconductor layer 535. The insulating layer 540 may include an insulating material, for example, silicon, silicon oxide, silicon nitride, or silicon oxynitride. Also, the insulating layer 540 may be a composite layer of a silicon oxide layer and a silicon nitride layer, or may be a silicon oxide layer that includes a nitrided silicon oxide layer therein.

The insulating layer 540 may protect the second semiconductor layer 530. For example, when the first electrode 150 and the second electrode 160 are formed and heat treated, any damage to the second semiconductor layer 530 and the third semiconductor layer 535 due to the heat treatment may be mitigated (or alternatively, prevented). Also, the insulating layer 540 may improve surface leakage current characteristics.

Description on the other constituent elements of the nitride-based semiconductor diode 500, including the substrate 110, the first semiconductor layer 120, the 2-DEG layer 125, the second semiconductor layer 530, the first electrode 150, and the second electrode 160, is the same as described above.

Figure 8:
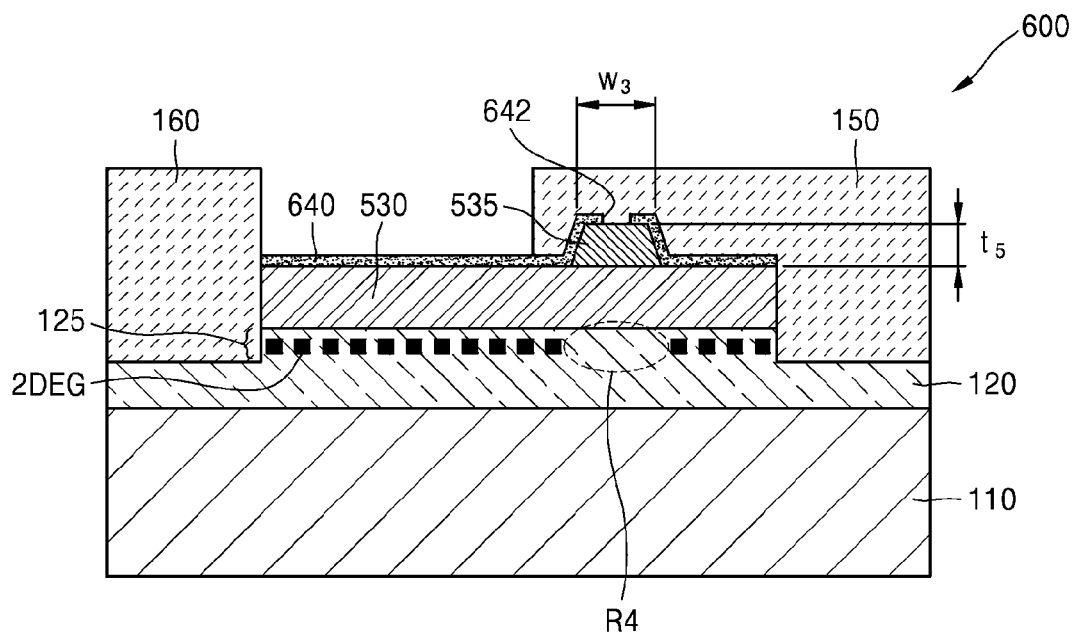
FIG. 8 is a schematic view of a nitride-based semiconductor diode according to at least one example embodiment.

FIG. 8 is a schematic view of a nitride-based semiconductor diode 500 according to at least one example embodiment.

Referring to FIG. 8, the nitride-based semiconductor diode 600 includes the substrate 110, the first semiconductor layer 120 that is disposed on the substrate 110 and is formed of a nitride-based semiconductor, the second semiconductor layer 530 that is disposed on the first semiconductor layer 120 and is formed of a nitride-based semiconductor, the third semiconductor layer 535 that is disposed on a portion of the second semiconductor layer 530 and is formed of a nitride-based semiconductor, the first electrode 150 that covers the third semiconductor layer 535 and forms an ohmic contact with the first semiconductor layer 120 and the second semiconductor layer 530, and the second electrode 160 that is spaced from the first electrode 150 and forms an ohmic contact with the first semiconductor layer 120 and the second semiconductor layer 530. In addition, the nitride-based semiconductor diode 600 further includes the insulating layer 640 that is disposed on the second semiconductor layer 530 and the third semiconductor layer 535, and a portion of the insulating layer 640 has an opening 642, which corresponds to the third semiconductor layer 535 such that a portion of the semiconductor layer 535 is exposed to the first electrode 150.

The nitride-based semiconductor diode 600 of FIG. 8 corresponds to a case in which the insulating layer 540 of the nitride-based semiconductor diode 500 of FIG. 7 has an opening. Accordingly, the other constituent elements of the nitride-based semiconductor diode 600 are the same as described above.

Referring to FIG. 8, the portion of the insulating layer 640 corresponding to the third semiconductor layer 535 has the opening 642. That is, a pathway may be formed along which charges gathered in the third semiconductor layer 435 due to an interior electric field flow to the first electrode 150 through the opening 642 of the insulating layer 640. In other words, the opening 642 of the insulating layer 440 allows charges, which may, otherwise, accumulate unnecessarily, to flow to the outside, thereby mitigating (or alternatively, preventing) any damage to the nitride-based semiconductor diode 600 due to charges. In addition, since the forward current or reverse current of the nitride-based semiconductor diode 600 does not flow through the opening 642 of the insulating layer 640, the opening 642 of the insulating layer 640 may not affect current-voltage characteristics of the nitride-based semiconductor diode 600.

Figure 9:
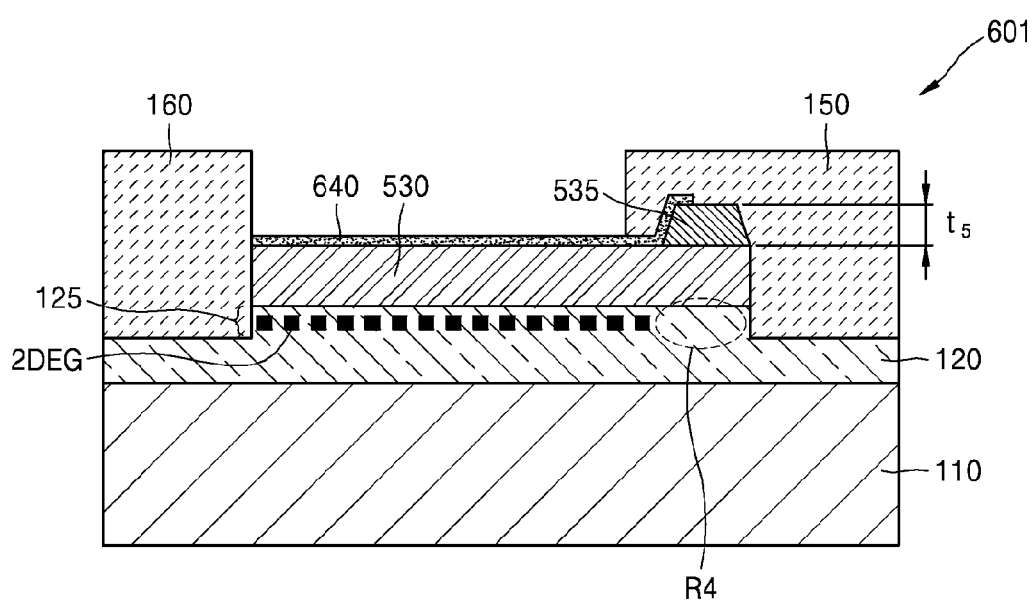
FIG. 9 is a schematic view of a nitride-based semiconductor diode according to at least one example embodiment.

FIG. 9 is a schematic view of a nitride-based semiconductor diode 601 according to at least one example embodiment. Constituents of the nitride-based semiconductor diode 601 illustrated in FIG. 9 which are substantially the same as those of the nitride-based semiconductor diode 600 of FIG. 8 are denoted by the same reference numerals as in FIG. 8, and detailed description thereof are omitted.

Referring to FIG. 9, the third semiconductor layer 535 is formed on an end of the second semiconductor layer 530. The insulating layer 640 covers a portion of the second semiconductor layer 530 between the second electrode 160 and the third semiconductor layer 535 and a portion of the third semiconductor layer 535. A side surface and a portion of a top surface of the third semiconductor layer 535 directly contacts the first electrode 150.

The nitride-based semiconductor diode 601 may allow a current to be easily supplied from the first electrode 150, and accordingly, a turn-on voltage of nitride-based semiconductor diode 601 may decrease.

Figure 10:
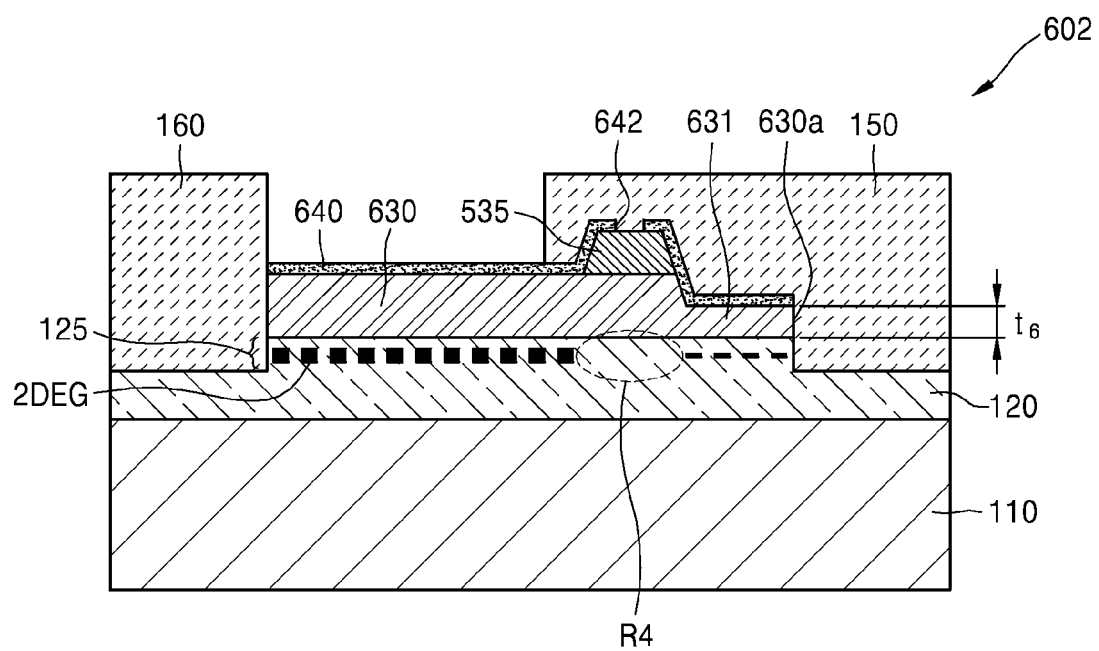
FIG. 10 is a schematic view of a nitride-based semiconductor diode according to at least one example embodiment.

FIG. 10 is a schematic view of a nitride-based semiconductor diode 602 according to at least one example embodiment.

Referring to FIG. 10, the nitride-based semiconductor diode 602 is different from the nitride-based semiconductor diode 600 in the structure of a second semiconductor layer 630, and constituents of the nitride-based semiconductor diode 602 that are substantially the same as those of the nitride-based semiconductor diode 600 may be denoted by the same reference numerals as used for the nitride-based semiconductor diode 600, and detailed description thereof will be omitted.

An end 630a of the second semiconductor layer 630 contacts the first electrode 150. The third semiconductor layer 535 is separated from the end 630a of the second semiconductor layer 630. In the second semiconductor layer 630, a first portion 631 is disposed between the third semiconductor layer 535 and the end 630a of the second semiconductor layer 630 may have a first thickness t6 that is smaller than that of the other portion of the second semiconductor layer 630.

In FIG. 10, the 2DEG is illustrated such that when an electron concentration is relatively high, the 2DEG is indicated as thicker dots, and when an electron concentration is relatively low, the 2DEG is indicated as thinner dots. The thicker dots, the higher electron concentration. A region in which 2DEG is not illustrated is a discontinuous region of 2DEG.

A 2DEG region disposed under the first portion 631 may have a smaller electron concentration. A 2DEG region disposed under the third semiconductor layer 535 is a discontinuous region R4.

The nitride-based semiconductor diode 602 may have a smaller turn-on voltage than the nitride-based semiconductor diode 600.

Figure 11:
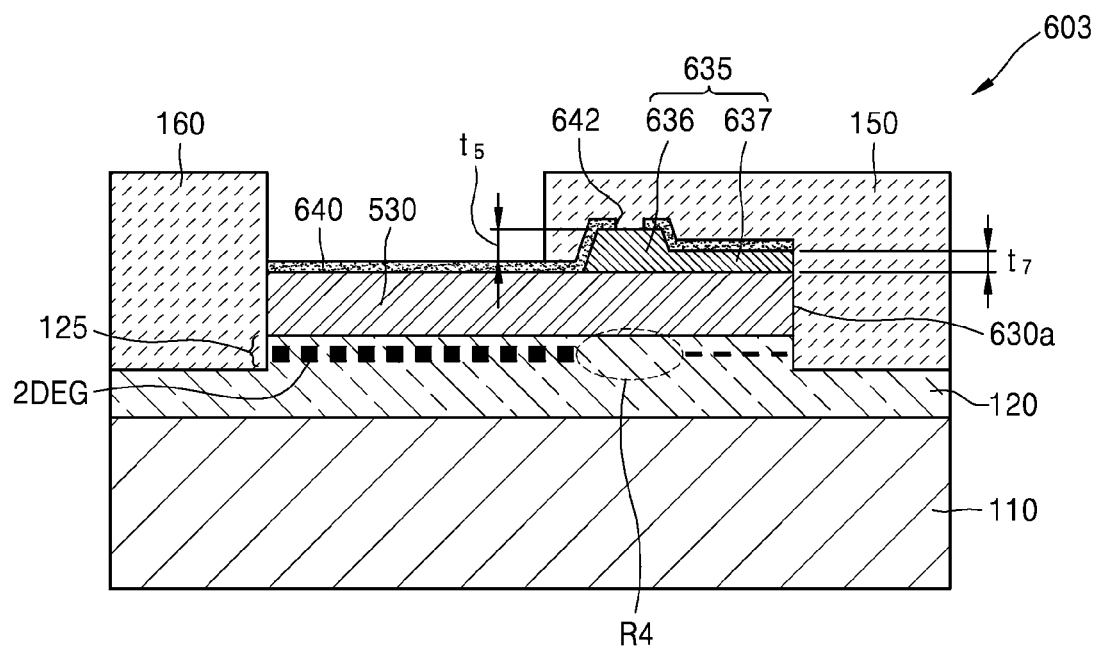
FIG. 11 is a schematic view of a nitride-based semiconductor diode according to at least one example embodiment.

FIG. 11 is a schematic view of a nitride-based semiconductor diode 603 according to at least one example embodiment.

Referring to FIG. 11, the nitride-based semiconductor diode 603 is different from the nitride-based semiconductor diode 600 in the structure of a second semiconductor layer 635, and constituents of the nitride-based semiconductor diode 603 that are substantially the same as those of the nitride-based semiconductor diode 600 may be denoted by the same reference numerals as used for the nitride-based semiconductor diode 600, and detailed description thereof will be omitted.

The end 630a of the second semiconductor layer 630 contacts the first electrode 150. The third semiconductor layer 635 includes a first portion 636 separated from the end 630a of the second semiconductor layer 630, a second portion 637 extending from the first portion 636 to the end 630a. A thickness t7 of the second portion may be smaller than the thickness t5 of the first portion 636.

In FIG. 11, the 2DEG is illustrated such that when an electron concentration is relatively high, the 2DEG is indicated as thicker dots, and when an electron concentration is relatively low, the 2DEG is indicated as thinner dots. The thicker dots, the higher electron concentration. A region in which 2DEG is not illustrated is a discontinuous region of 2DEG.

A 2DEG region disposed under the first portion 636 of the third semiconductor layer 635 is a discontinuous region R3 in which 2DEG is not present, and a 2DEG region disposed under the second portion 637 has a relatively lower electron concentration than a 2DEG region except the discontinuous region R4. The nitride-based semiconductor diode 603 may have a smaller turn-on voltage than the nitride-based semiconductor diode 600.

FIGS. 12A to 12E are cross-sectional views schematically illustrating a method of manufacturing the nitride-based semiconductor diode 500 of FIG. 7.

Figure 12A:
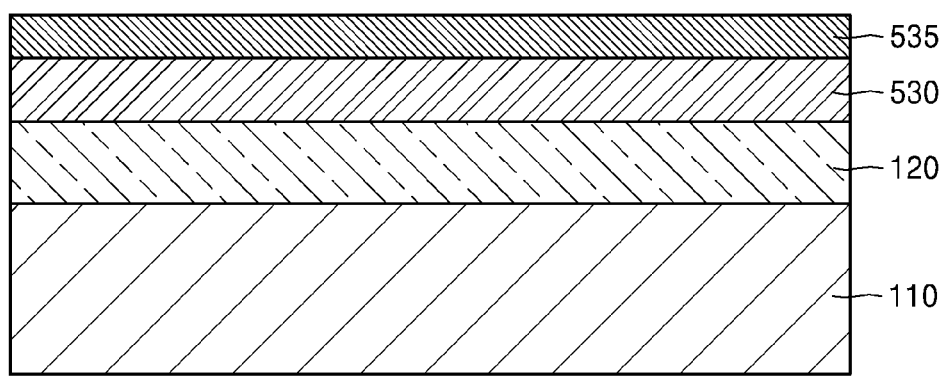
FIGS. 12A to 12E are cross-sectional views schematically illustrating a method of manufacturing the nitride-based semiconductor diode of FIG. 4 and the nitride-based semiconductor diode of FIG. 5.

Referring to FIG. 12A, the first semiconductor layer 120, the second semiconductor layer 530, and the third semiconductor layer 535 may be sequentially formed on the substrate 110. The first semiconductor layer 120, the second semiconductor layer 530, and the third semiconductor layer 535 may be formed by using various methods that are typically known as a compound semiconductor growth method. For example, epitaxial deposition, MOCVD, HVPE, MBE, MOVPE, or HCVD may be used.

Various buffer layers may be formed between the substrate 110 and the first semiconductor layer 120 to mitigate (or alternatively, prevent) a decrease in crystallinity of the first semiconductor layer 120 to reduce a lattice constant difference and a thermal expansion coefficient difference of the substrate 110 and the first semiconductor layer 120. These buffer layers may be formed by using various methods that are typically known as a compound semiconductor growth method.

Figure 12B:
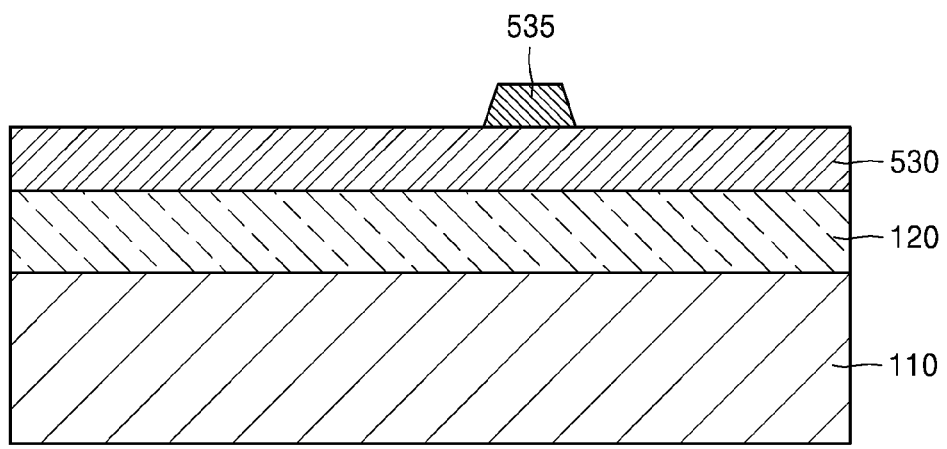

Referring to FIG. 12B, the third semiconductor layer 535 may be patterned so that only a portion thereof remains by etching. The etch process may be performed by using an etching process using a patterned mask. For example, the etching process may be a wet process in which a strong acid, such as KOH, and UV rays are used. As another example, the etch process may be a dry process, such as an inductively coupled plasma etching using $Cl_2$, $BCl_3$, $CCl_2F_2$ and/or other chlorides, or a reactive ion etching, such as electron cyclotron resonance and/or downstream plasma etching in which a DC element is not present in plasma.

Figure 12C:
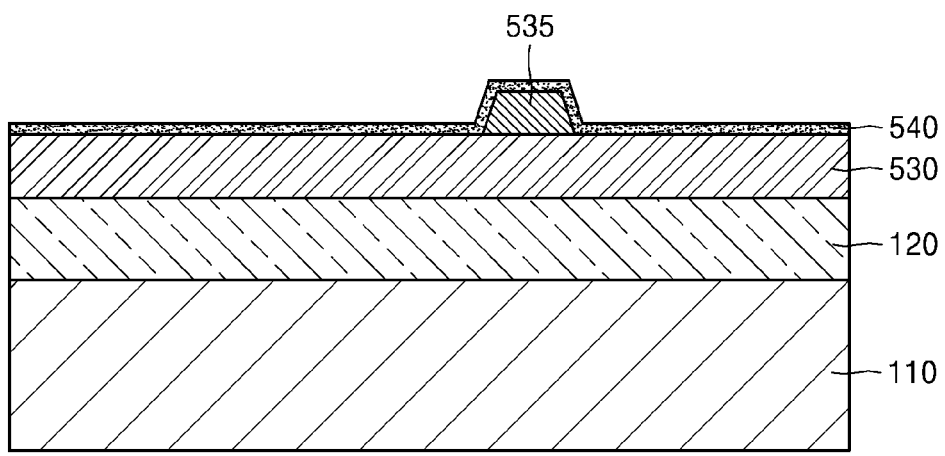

Referring to FIG. 12C, the insulating layer 540 may be formed on the second semiconductor layer 530 and third semiconductor layer 535. The insulating layer 440 may include an insulating material, for example, silicon, silicon oxide, silicon nitride, or silicon oxynitride. The insulating layer 540 may be formed by using various deposition methods. The insulating layer 540 may be a composite layer of a silicon oxide layer and a silicon nitride layer, or may be a silicon oxide layer that includes a nitrided silicon oxide layer therein. The nitriding may be performed by, for example, annealing using nitrogen-containing gas, such as $NH_3$ gas, RTA, or laser RTA. In addition, the nitriding may be performed by plasma nitriding, plasma ion implantation, PECVD, HDP-CVD, or radical nitriding. Following the nitriding, the resultant structure is heat treated in an inert atmosphere containing an inert gas, such as helium or argon.

To manufacture the nitride-based semiconductor diode 600 of FIG. 8, following the formation of the insulating layer 540, an etching process may be additionally performed to remove a portion of the insulating layer 540 corresponding to the third semiconductor layer 535, thereby forming an opening (see 642 of FIG. 8).

Figure 12D:
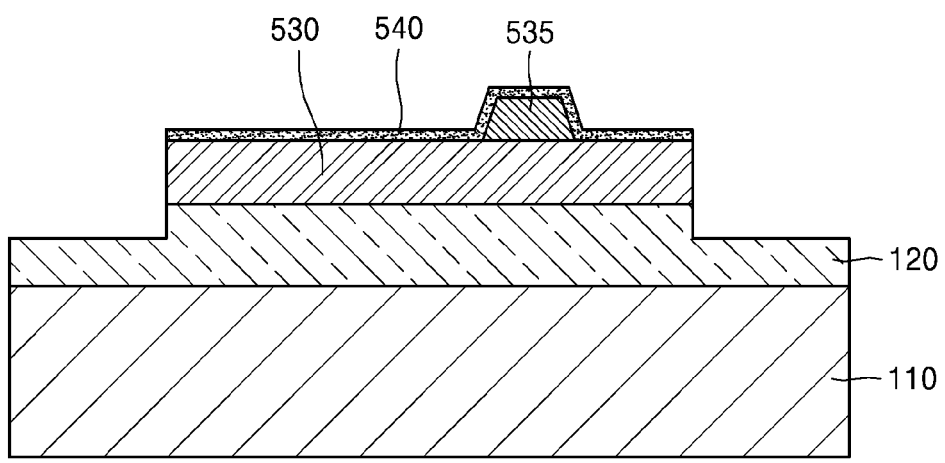

Referring to FIG. 12D, to form the first electrode 150 and the second electrode 160 on the first semiconductor layer 120, both ends of the insulating layer 540 and the second semiconductor layer 530 may be removed using an etching process. For example, the etching process may be a wet process in which a strong acid, such as KOH, and UV rays are used. As another example, the etch process may be a dry process, such as an inductively coupled plasma etching using $Cl_2$, $BCl_3$, $CCl_2F_2$ and/or other chlorides, or a reactive ion etching, such as electron cyclotron resonance and/or downstream plasma etching in which a DC element is not present in plasma. The etching for forming the first electrode 150 and the second electrode 160 may extend to the first semiconductor layer 120. However, this is an example only, and the etching may be formed only in the second semiconductor layer 530.

Figure 12E:
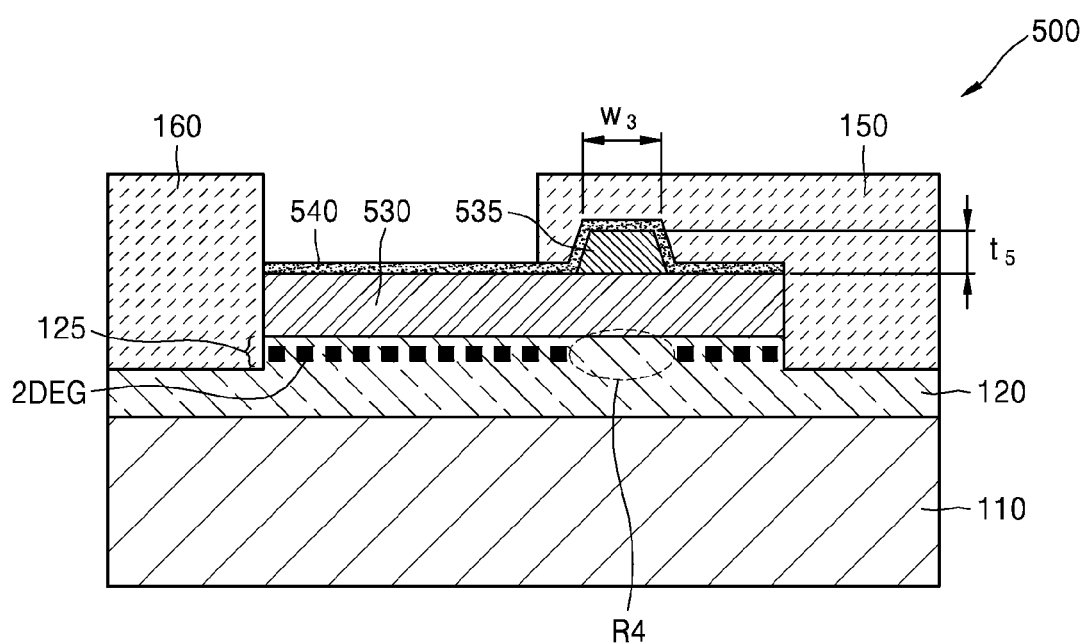

Referring to FIG. 12E, the first electrode 150 and the second electrode 160 for applying a voltage to the nitride-based semiconductor diode 500 may be formed. The first electrode 150 and the second electrode 160 may each include a conductive material, for example, metal, metal alloy, conductive metal oxide, or conductive metal nitride. The first electrode 150 and the second electrode 160 may each be formed by CVD, PECVD, low pressure CVD, LPCVD, physical vapor deposition (PVD), sputtering, or atomic layer deposition (ALD). The first electrode 150 and the second electrode 160 may form an ohmic contact, and may be simultaneously formed.

A method of manufacturing the nitride-based semiconductor diodes of FIGS. 8 to 11 would be obvious by referring to the method of manufacturing the nitride-based semiconductor diode of FIG. 7, and accordingly, detailed description thereof will be omitted.

Figure 13A:
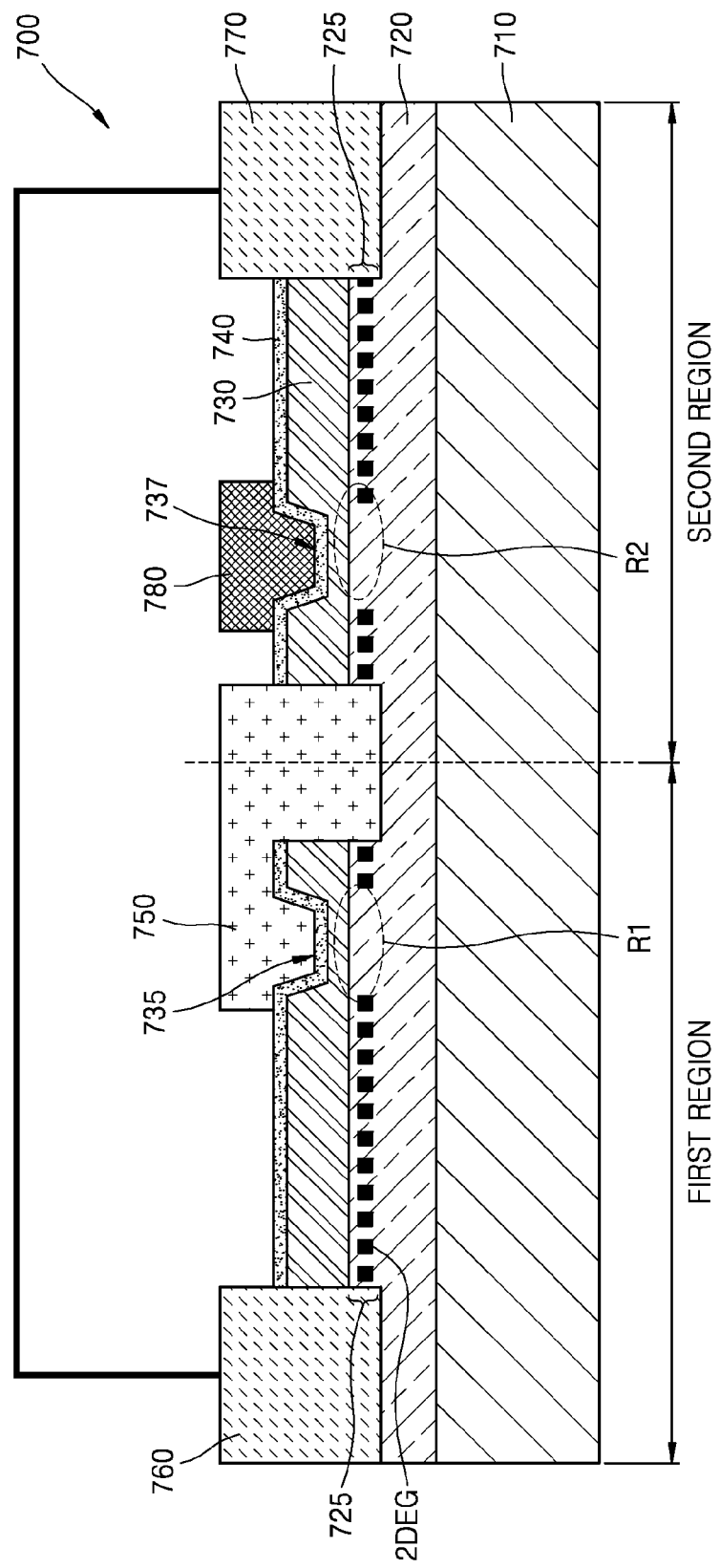
FIG. 13A is a schematic cross-sectional view of a nitride-based semiconductor integrated device according to at least one example embodiment.

FIG. 13A is a schematic cross-sectional view of a nitride-based semiconductor integrated device 700 according to at least one example embodiment.

Referring to FIG. 13A, the nitride-based semiconductor integrated device 700 includes a substrate 710, a first semiconductor layer 720 that is disposed on the substrate 710 and is formed of a nitride-based semiconductor, a second semiconductor layer 730 that is disposed on the first semiconductor layer 720, is formed of a nitride-based semiconductor, and has a first portion 735 and a second portion 737 each having a thickness that is smaller than that of the other portion of the second semiconductor layer 730, an insulating layer 740 disposed on the second semiconductor layer 730, a first electrode 750 that covers the first portion 735 and forms an ohmic contact with the first semiconductor layer 720 and the second semiconductor layer 730, a gate electrode 780 that is spaced apart from the first electrode 750 and is disposed on the second portion 737, and a second electrode 760 and a third electrode 770, each of which is disposed on an upper end of the first semiconductor layer 720 and forms an ohmic contact with the first semiconductor layer 720 and the second semiconductor layer 730.

Figure 13B:
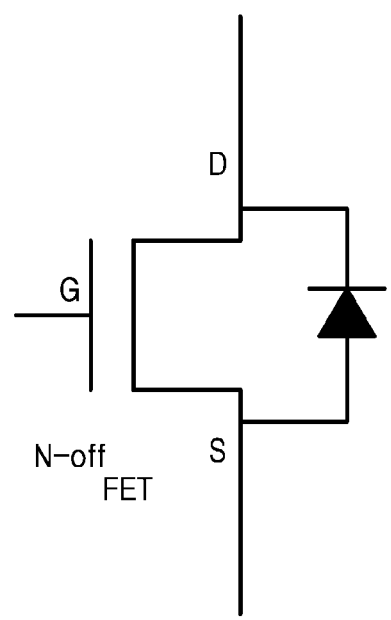
FIG. 13B is a schematic circuit diagram of the nitride-based semiconductor integrated device of FIG. 13A.

FIG. 13B is a schematic circuit diagram of the nitride-based semiconductor integrated device 700 of FIG. 13A.

Referring to FIG. 13B, the nitride-based semiconductor integrated device 700 may be manufactured by embodying at least one diode and at least one transistor on a single chip. For example, the nitride-based semiconductor integrated device 700 may be a device in which a nitride-based semiconductor diode and a nitride-based semiconductor transistor that is normally off are connected to each other in parallel. In this case, the nitride-based semiconductor integrated device 700 may be a device for use in a switch for driving a motor. In detail, the nitride-based semiconductor integrated device 700 may be an inverter that is embodied by using six devices in which a diode and a transistor are connected to each other in parallel.

Referring to FIG. 13A, a nitride-based semiconductor diode is located in a first region. Although the nitride-based semiconductor diode 700 illustrated in FIG. 13A is the nitride-based semiconductor diode 100 of FIG. 1A, the diode located in the first region may be selected from the nitride-based semiconductor diodes 100, 200, 300, 400, 401, 500, 600, 601 602, and 603 and nitride-based semiconductor diodes manufactured by modifying the nitride-based semiconductor diodes 100, 200, 400, and 500.

In FIG. 13A, a nitride-based semiconductor transistor that is normally off is located in a second region. The first semiconductor layer 720 and the second semiconductor layer 730 form a heterostructure, and thus, a 2-DEG layer 725 acting as a channel is formed in the first semiconductor layer 720. The concentration of 2-DEG that is generated in the first semiconductor layer 720 may be decreased or increased by the second portion 737. Accordingly, when a voltage is not applied to the gate electrode 780, a channel is not formed. Thus, the nitride-based semiconductor transistor is normally off. The second portion 737 may have a recess-shape as illustrated, or a step-shape (see 435 of FIG. 4).

The gate electrode 780 may be formed of a material that forms a Schottky contact with the second semiconductor layer 730. For example, the gate electrode 780 may include at least one selected from Ni, Ti, Au, Pt, and ITO. However, in some cases, the gate electrode 780 may not form a Schottky contact with the second semiconductor layer 730. The insulating layer 740 may be provided between the gate electrode 780 and the second semiconductor layer 730. The insulating layer 740 may reduce (or alternatively, prevent) formation of a leakage current flowing from the second semiconductor layer 730 to the gate electrode 780. When the insulating layer 740 is formed, the Schottky contact may be absent. Also, in this case, the insulating layer 740 may be formed of the same material as used in the first electrode 750, the second electrode 760, and the third electrode 770.

Referring to FIG. 13A, the first electrode 750 may be an anode of the nitride-based semiconductor diode and at the same time, a source electrode of the nitride-based semiconductor transistor. In addition, the second electrode 760 may be a cathode of the nitride-based semiconductor diode and at the same time, a drain electrode of the nitride-based semiconductor transistor. The second electrode 760 and the third electrode 770 may be electrically connected to each other by forming a pattern on the nitride-based semiconductor integrated device 700.

The 2DEG layer 725 includes 2DEG. The 2DEG layer 725 has discontinuous regions R1 and R2, in which 2DEG is not present, respectively disposed under the first portion 735 and the second portion 737.

FIG. 14 is a schematic cross-sectional view of a nitride-based semiconductor integrated device 800 according to at least one example embodiment.

Referring to FIG. 14, the nitride-based semiconductor integrated device 800 includes a substrate 810, a first semiconductor layer 820 that is disposed on the substrate 810 and is formed of a nitride-based semiconductor, a second semiconductor layer 830 that is disposed on the first semiconductor layer 720 and is formed of a nitride-based semiconductor, a third semiconductor layer 835 and a fourth semiconductor layer 837, each of which is disposed on a portion of the second semiconductor layer 830 and is formed of a nitride-based semiconductor, a first electrode 850 that covers the third semiconductor layer 835 and forms an ohmic contact with the first semiconductor layer 820 and the second semiconductor layer 830, a gate electrode 880 that is spaced apart from the first electrode 850 and is disposed on the fourth semiconductor layer 837, and a second electrode 860 and a third electrode 870, each of which is disposed on an upper end of the first semiconductor layer 820 and forms an ohmic contact with the first semiconductor layer 820 and the second semiconductor layer 830. Also, the nitride-based semiconductor integrated device 800 may further include an insulating layer 840 provided on the second semiconductor layer 830, the third semiconductor layer 835, and the fourth semiconductor layer 837. The insulating layer 840 may have openings 841 and 842 corresponding to the third semiconductor layer 835 and the fourth semiconductor layer 837.

The 2DEG layer 825 includes 2DEG. The 2DEG layer 825 has discontinuous regions R1 and R2, in which 2DEG is not present, respectively disposed under the first portion 835 and the second portion 837.

The nitride-based semiconductor integrated device 800 may be manufactured by embodying at least one diode and at least one transistor on a single chip. For example, the nitride-based semiconductor integrated device 800 may be a device in which a nitride-based semiconductor diode and a nitride-based semiconductor transistor that is normally off are connected to each other in parallel. In this case, the nitride-based semiconductor integrated device 800 may be a device for use in a switch for driving a motor. In detail, the nitride-based semiconductor integrated device 800 may be an inverter that is embodied by using six devices in which a diode and a transistor are connected to each other in parallel.

Referring to FIG. 14, a first region indicates a nitride-based semiconductor diode. Although the nitride-based semiconductor diode illustrated in FIG. 14 is the nitride-based semiconductor diode 600 of FIG. 8, the diode located in the first region may be selected from the nitride-based semiconductor diodes 100, 200, 300, 400, 401, 500, 601, 602, and 603, and nitride-based semiconductor diodes manufactured by modifying the nitride-based semiconductor diodes 100, 200, 300, 400, 401, 500, 600, 601, 602, and 603.

In FIG. 14, a nitride-based semiconductor transistor that is normally off is located in a second region. The first semiconductor layer 820 and the second semiconductor layer 830 form a heterostructure, and thus, a 2-DEG layer 825 acting as a channel is formed in the first semiconductor layer 820. The concentration of 2-DEG that is generated in the first semiconductor layer 820 may be decreased or increased by the fourth semiconductor layer 837. Accordingly, when a voltage is not applied to the gate electrode 880, a channel is not formed. Thus, the nitride-based semiconductor transistor is normally off. The fourth semiconductor layer 837 may be formed of p-type doped GaN.

Referring to FIG. 14, the first electrode 850 may be an anode of the nitride-based semiconductor diode and at the same time, a source electrode of the nitride-based semiconductor transistor. In addition, the second electrode 860 may be a cathode of the nitride-based semiconductor diode and at the same time, a drain electrode of the nitride-based semiconductor transistor. The second electrode 860 and the third electrode 870 may be electrically connected to each other by forming a pattern on the nitride-based semiconductor integrated device 870.

As described above, the nitride-based semiconductor diodes may have a heterostructure of nitride-based semiconductors, and thus, may be suitable for use as a high-power and high-frequency diode. In addition, to control a region in which 2-DEG is generated, a second semiconductor layer includes a relatively thin portion or a third semiconductor layer, thereby enabling a control of a turn-on voltage of the forward current. Also, the structure according to at least one example embodiment provides a small leakage current without a Schottky contact of an electrode. Accordingly, a Schottky contact process is not performed, and thus, the process time and the process cost of a nitride-based semiconductor diode may be reduced. Also, a nitride-based semiconductor diode may be integrated with various nitride-based semiconductor devices.

Up to now, exemplary embodiments of the nitride-based semiconductor diodes have been presented to help understanding of the inventive concepts, and are illustrated in the attached drawings. It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A nitride-based semiconductor diode comprising:
   a substrate;
   a first semiconductor layer disposed on the substrate;
   a second semiconductor layer disposed on the first semiconductor layer, the first and second semiconductor layers including a nitride-based semiconductor, and a first portion of the second semiconductor layer having a thickness thinner than a second portion of the second semiconductor layer;
   an insulating layer disposed on the second semiconductor layer;

a first electrode overlapping the first portion of the second semiconductor layer when viewed from a plan view and forming an ohmic contact with the first semiconductor layer and the second semiconductor layer; and a second electrode separated from the first electrode, the second electrode forming an ohmic contact with the first semiconductor layer and the second semiconductor layer, wherein the first portion of the second semiconductor layer is a recess, and the first electrode fills the recess with the insulating layer therebetween.

2. The nitride-based semiconductor diode of claim 1, wherein the second semiconductor layer further comprises a third portion that is thicker than the first portion and is thinner than the second portion between an end of the second semiconductor layer contacting the first electrode and the first portion.

3. The nitride-based semiconductor diode of claim 2, wherein the second semiconductor layer further comprises a fourth portion having a thickness that is substantially identical to a thickness of the second portion between the third portion and the end of second semiconductor layer.

4. The nitride-based semiconductor diode of claim 1, wherein the first semiconductor layer and the second semiconductor layer form a heterostructure, and a 2-dimensional electron gas is generated in the first semiconductor layer.

5. The nitride-based semiconductor diode of claim 4, wherein a discontinuous region of a 2-dimensional electron gas is formed in a portion of the first semiconductor layer which corresponds to the first portion of the second semiconductor layer.

6. The nitride-based semiconductor diode of claim 5, wherein if a voltage is applied to the first electrode, then the discontinuous region is filled with electrons and current flows.

* * * * *